(12) United States Patent
Miyamoto

(10) Patent No.: US 6,304,095 B1
(45) Date of Patent: *Oct. 16, 2001

(54) SEMICONDUCTOR MEASUREMENT INSTRUMENT WITH THE CAPABILITY TO DYNAMICALLY CHANGE EXAMINATION CRITERIA

(75) Inventor: Takashi Miyamoto, Tokyo (JP)

(73) Assignee: Agilent Technologies, Inc., Loveland, CO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,232

(22) Filed: Nov. 30, 1998

(30) Foreign Application Priority Data

Dec. 2, 1997 (JP) .................................................. 9-331644

(51) Int. Cl.[7] ............................ G01R 31/02; G01R 31/26
(52) U.S. Cl. ......................... 324/765; 324/758; 324/754
(58) Field of Search .................................. 324/765, 758, 324/754; 714/724, 734, 742

(56) References Cited

U.S. PATENT DOCUMENTS 5,495,578 * 2/1996 Rohrbaugh et al. ............... 364/265.6
5,793,650 * 8/1998 Mizra ................................... 324/765

OTHER PUBLICATIONS

HP Specs User's Guide (Hewlett–Packard), 1997, pp. 1–2—3–67 (1997).
IC–MS User's Manual (Hewlett–Packard), vol. 1, General Operations, pp. 1–3—7–44 (1995).

* cited by examiner

Primary Examiner—Safet Metjahic
Assistant Examiner—Jermele M. Hollington

(57) ABSTRACT

The purpose of the present invention is to make possible the changing of examination criteria for whether the object tested passes or fails the test without stopping the testing process of a semiconductor parametric tester used to test wafers, etc., and thereby reduce the number of times tests are repeated. The measurement program has a means whereby the limits that determine the range of the binning with which the measurement results are evaluated can be changed as the tests are being performed. Thus, it is possible to reduce the processes that take time, that is, stopping and repeating tests, and the testing efficiency is thereby improved.

10 Claims, 7 Drawing Sheets

SEMICONDUCTOR MEASUREMENT INSTRUMENT WITH THE CAPABILITY TO DYNAMICALLY CHANGE EXAMINATION CRITERIA

FIELD OF THE INVENTION

The present invention pertains to a semiconductor measurement instrument capable of dynamically changing examination criteria. In particular, the invention relates to a semiconductor measurement instrument capable of dynamically changing examination criteria used in semiconductor parametric test systems which measure semiconductor parameters on a wafer and evaluate whether a test has been passed or failed, evaluate properties, etc.

BACKGROUND OF THE INVENTION

Wafer testing during production of semiconductor circuit elements is one use of semiconductor parametric testers. An example of a semiconductor parametric tester used for this purpose will be described while referring to FIG. 1. Semiconductor parametric test system 1 has a tester unit 3 which feeds electrical signals to wafer 2 serving as the object to be measured and measures the electrical signals from wafer 2. Test system 1 also has a prober 5 which takes wafer 2 from wafer lot 4 and brings a probe into contact with a specific die. Computer 6A controls tester unit 3 and prober 5 and processes the measurement data. Measurement program 6B operates computer 6A.

Measurement program 6B has a test plan 7, which consists of a specification for wafer 2 and the devices on the wafer, etc.; a measurement algorithm 8 which consists of files that define the measurement algorithm; core program 9 which initiates each part and loads and executes test plan 7 and measurement algorithm 8, etc.; and a limit file 10. Moreover, measurement program 6B includes user interface program 9a, through which data is input from and output to an operator via a display and a keyboard.

Test plan 7, measurement algorithm 8, and limit file 10 each have, for instance, a fill-in-the-box builder 7e, 8c, 10a, respectively so that the user can easily construct files.

Test plan 7 includes wafer spec 7a which defines the name, location, and other attributes of the dies on a wafer; a die spec 7b which defines the name and location of the modules on the dies; a probe spec 7c, which defines the pin connections between the device pad of the probe card and the switching matrix; and a test spec 7d, which defines the measurement algorithms used to test the device.

Hereafter is defined the terminology used in the present specification and in reference to FIG. 2. The wafers 20 includes a set of several dies 22, with several dies 22 defining one wafer, the dies 22 include a set of modules 24, with several modules 24 defining one die 22. The modules 24 include are a set of devices 26 and are the largest unit that can be programmed at a time. The devices 26 are the units on the module 24, such as a resistor, MOSFET, transistor, etc. Moreover, a wafer lot is a set of wafers 20 and is the unit that can be submitted to a prober 5 at one time.

Referring to FIG. 3, test spec 7d defines the measurement algorithm 8 to be used in testing a device 26. Basically, the test spec 7d defines the device 26 to be measured, the name of the measurement algorithm 8, the number 30 of the pad to be connected to the device terminal, the input variable 32 for the argument of each measurement algorithm 8, the returned value (measurement result) for each measurement algorithm 8, the output variable 36 for each binning limit, etc.

Here, binning is a block where the numbers associated with the measurements have been segregated between certain values and values that define a block are called the limits. Binning is used to define a range when evaluating whether or not a measurement fails to meet the value that the user expects; to statistically analyze the measurement results for evaluation of the properties of the object being measured and for evaluation of the production processes; to define a range when evaluating whether the measurements are valid or invalid; etc. The limits are written in limit file 10 in FIG. 1 and are incorporated into test spec 7d.

Measurement algorithm 8 determines the order in which semiconductor parameter tests are executed, the device parameters are extracted, etc., and includes algorithm spec 8a and algorithm library 8b. Algorithm spec 8a defines specifications, including the input variable, output variable, device variable, name of the device terminal, etc., for each measurement algorithm. Algorithm library 8b is constructed from subprograms that use the individual algorithm functions.

The above described device is an example of a conventional semiconductor parametric test system. However, that system does have problems. Those problems will be described while referring to the test flow chart in FIG. 8.

When a wafer is tested by conventional test system 1, the wafer lot is set on the prober (81a) and the wafer on the prober is selected (81b). The test shell (core program) is started (82a), the test plan is selected (82b) and the limit file is selected (82c). Thus, it is now possible to test the wafer, and once the wafer is loaded (81c), the test is started (82).

The dies arranged on the wafer are measured (83) in accordance with a specific order that has been determined by the test plan. The system evaluates whether the wafer passes or fails and whether the measurements are valid or invalid using the binning from the limit file that was selected in 82c (84). These data are then recorded in the computer memory (85). The program determines whether there are any dies remaining once it completes the measurements of one die (86) and this measurement process is repeated until the measurements of the objects to be measured on the wafer have all been completed.

However, the limits are determined by the user and therefore, there are cases where these limits are not necessarily the optimum limits and changes based on measurement results become necessary. In this case, the test must first be stopped, the wafer is unloaded, as shown in step 87, and then a different limit file must be read in order to change the limits. As a result, for instance, limit file B is incorporated into the test plan and re-testing is performed based on this file, as shown in FIG. 3.

This re-running of measurements takes time and has an effect on throughput of the semiconductor circuit production process. Moreover, it also increases cost when re-running of measurements is performed by an operator. Therefore, there is a need for a system with a flexible test plan that allows for monitoring the measurement results as a test is being performed and for automatic changing of the examination criteria without stopping the test.

An object of the invention is to provide a test system wherein criteria for evaluating whether a test is passed or failed can be changed without stopping the test, by changing the limits automatically, or by operator request.

SUMMARY OF THE INVENTION

The present invention is a semiconductor measurement instrument that is capable of dynamically changing its examination criteria. In particular, the invention is a semiconductor measurement instrument that is capable of dynamically changing criteria for evaluating whether a test is passed or failed. The invention can be used in semiconductor parametric test systems that measure parameters of semiconductors on a wafer and evaluate whether the test is passed or failed, that evaluate properties, etc., during semiconductor integrated circuit production process, etc.

This characteristic is realized by a function that enables the contents of a limit file that have been written to be changed as the test is being executed. In order to make this function easy to use, the invention has a structure wherein the binning, which can be freely designed by the user, is recorded in one limit file and the criteria for evaluating whether the test is passed or failed and the range of valid measurements are selected from several user binnings.

DETAILED DESCRIPTION OF THE INVENTION

Figure 1:
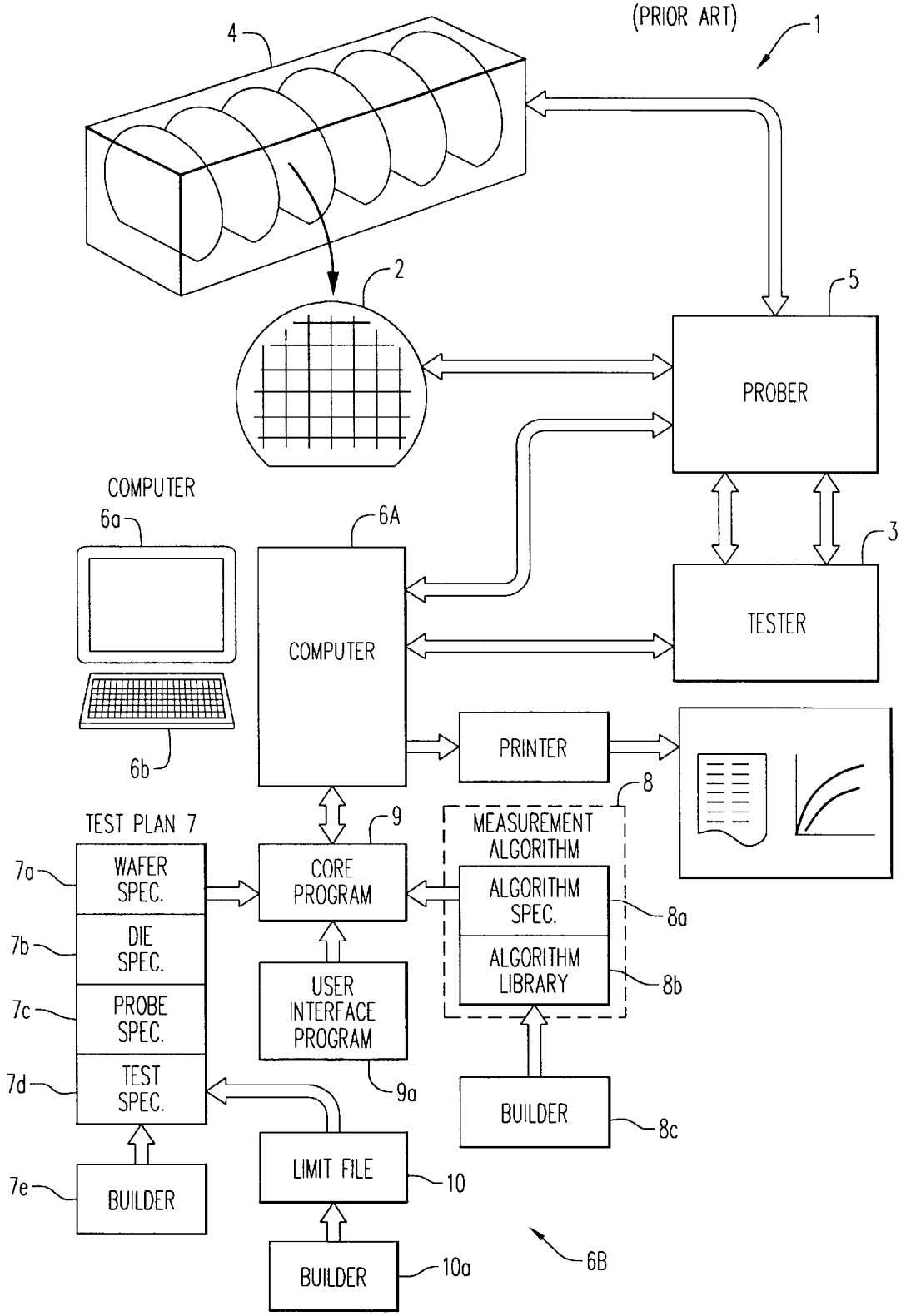
FIG. 1 is a block diagram showing both prior art examples and the present invention.
Figure 2:
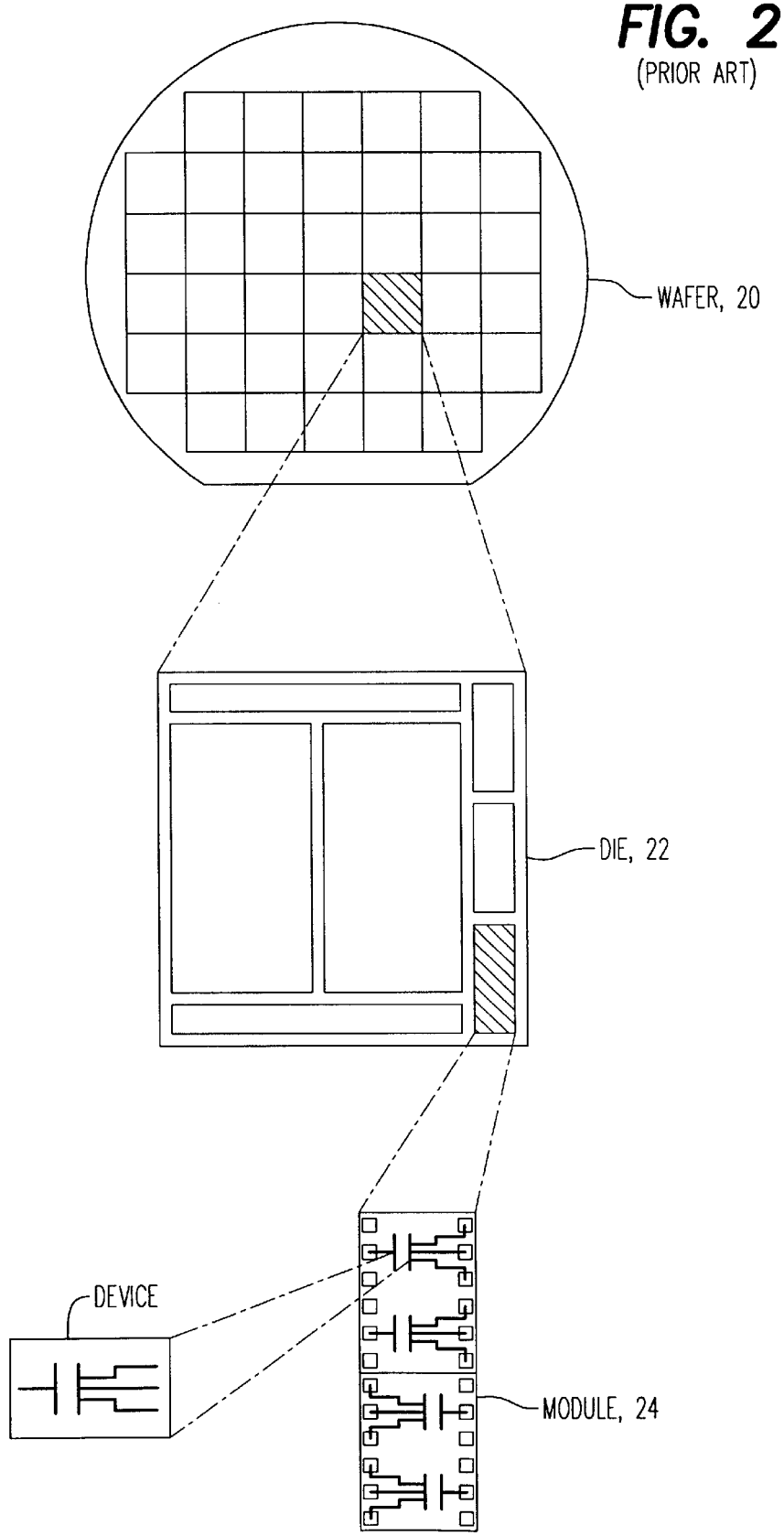
FIG. 2 is a diagram that helps define the terms wafer, die, module and device in the present Specification.
Figure 3:
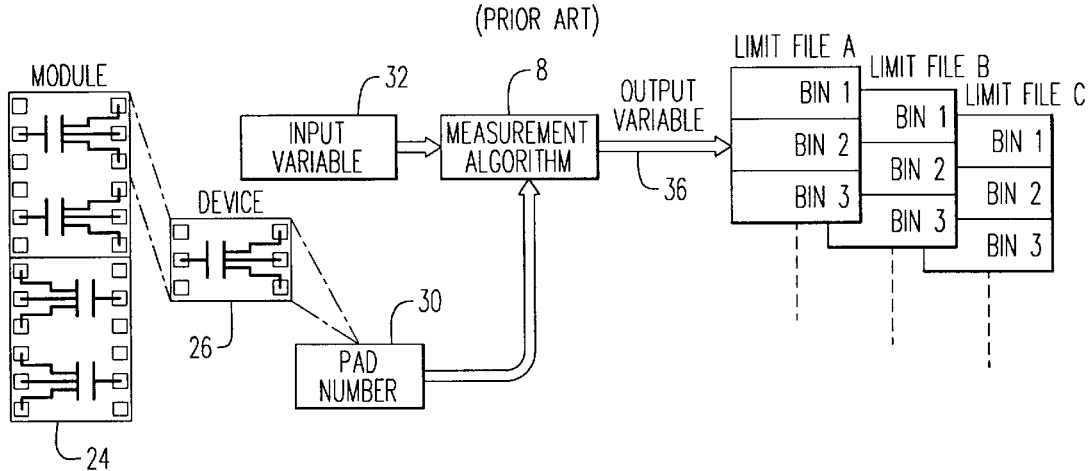
FIG. 3 is a diagram that describes the test spec and limit file of a prior art example.
Figure 4:
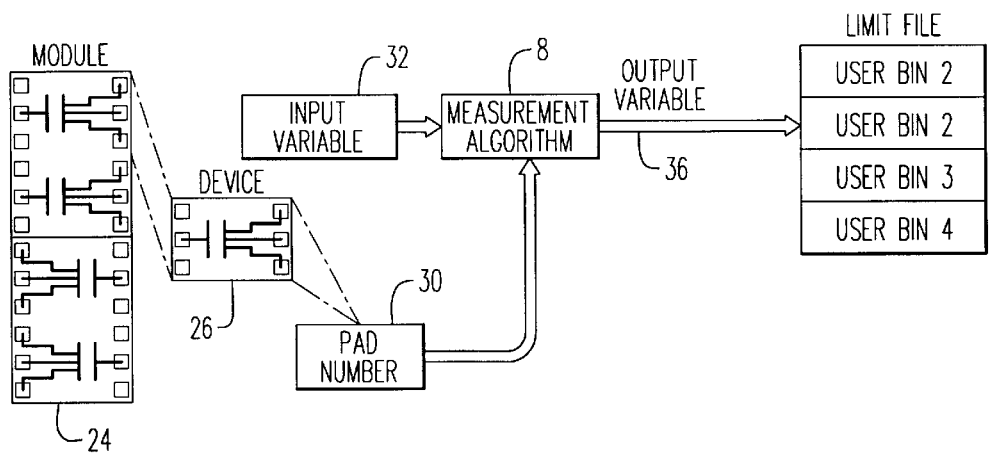
FIG. 4 is a diagram that describes the test spec and limit file of the present invention.

The present invention will now be explained based on the example shown in the figures. Semiconductor measurement instrument 1, which is capable of dynamically changing examination criteria has almost the same structure as the prior art example that was explained using FIG. 1. The point of difference is test program group 6B.

Figure 5:
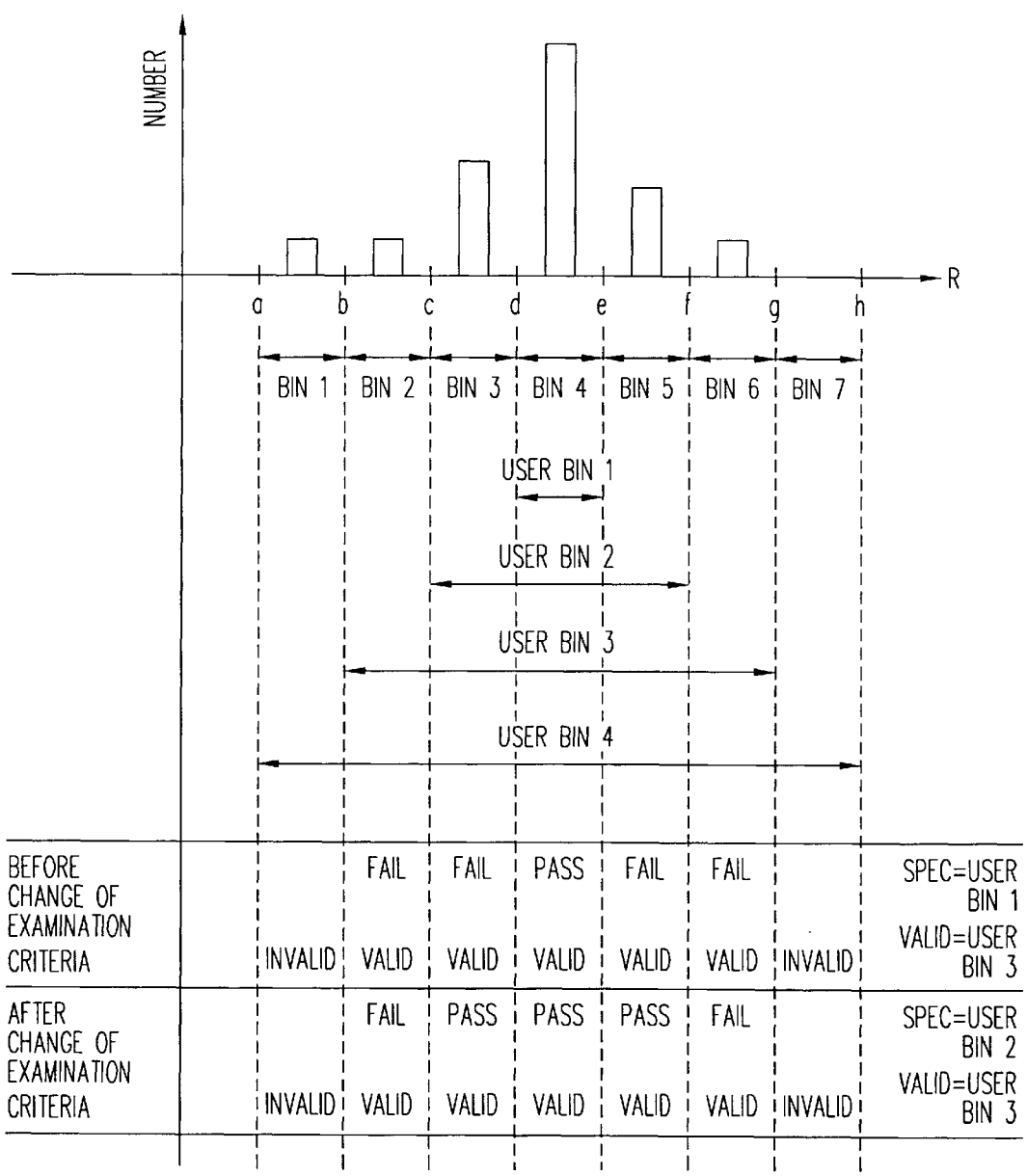
FIG. 5 is a diagram that describes changes in the user BIN and the examination criteria.

The particularly obvious differences involve limit file 10, test spec 7d and measurement algorithm 8. The following items are added to the items recorded in limit file 10 of the present invention:

1. Limits (several)
2. A range obtained by setting any 2 of the limits as an upper limit and lower limit, respectively (referred to below as user BIN, of which there are several).
   Referring to FIG. 5, for example, user BIN 1 is entered as lower limit d and upper limit e, user BIN 2 is entered as lower limit c and upper limit f, user BIN 3 is entered as lower limit b and upper limit g, and user BIN 4 is entered as lower limit a and upper limit h.
3. The ranges in item 2 that are valid "as a measurement" (referred to as VALID below).
4. The ranges in item 2 that "fulfill the properties expected of the device" (referred to below as SPEC, always within VALID). Here, it is initially written as SPEC= user BIN 1, VALID=user BIN 3.

Measurement algorithm 8 of the present invention includes the following:

1. A measurement algorithm function for referring to measurement results and results of evaluating whether a test is passed or failed as the test is being executed;
2. A measurement algorithm function for changing the contents of a limit file that has been read, that is, SPEC and VALID, to a different user BIN defined in the limit file; and
3. A measurement algorithm function that refers to data in the current user BIN.

Figure 9:
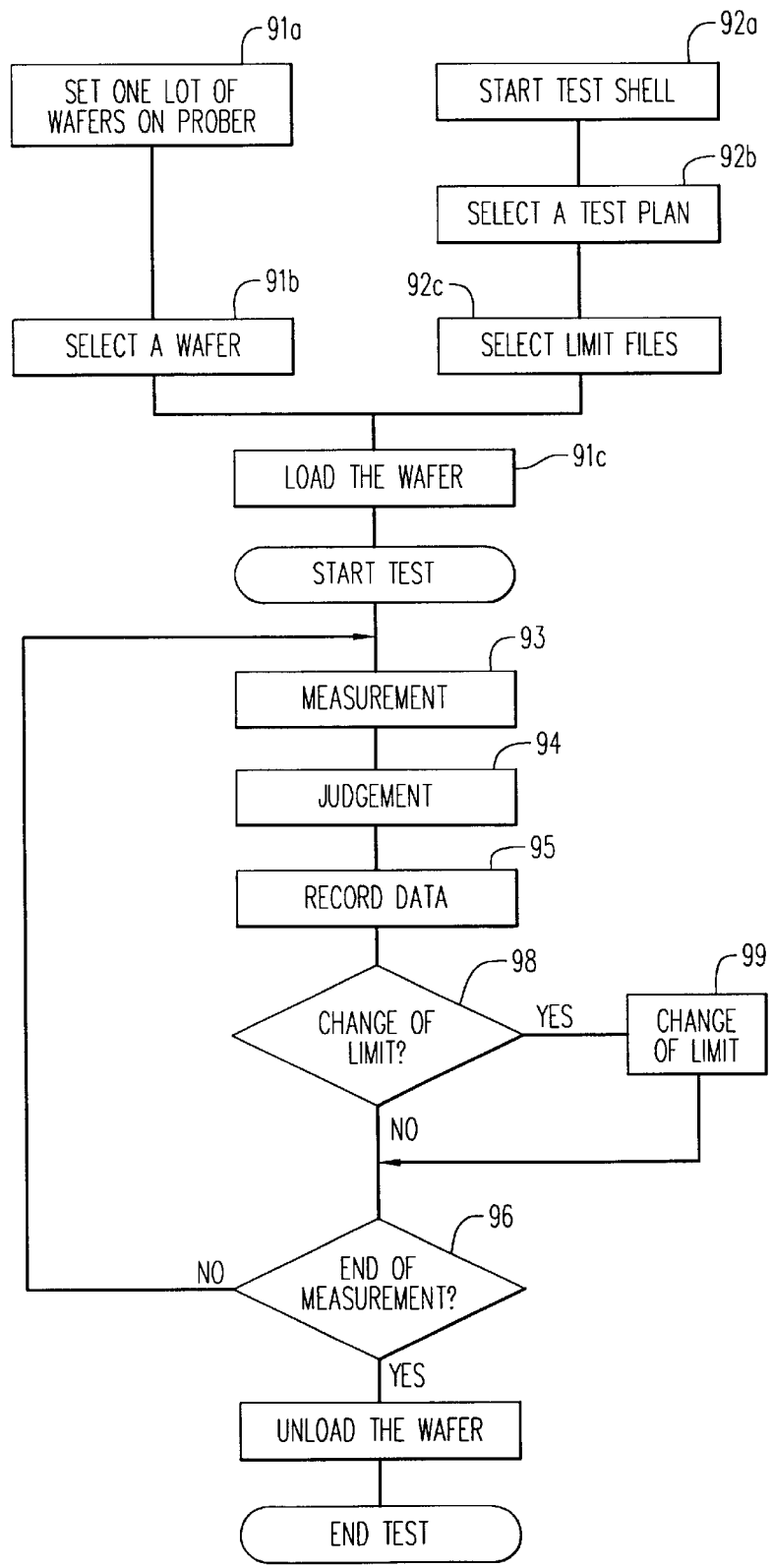
FIG. 9 is a flow chart that shows the wafer testing process of the present invention.

The operation of the invention will now be explained with reference to FIG. 9. The test plan and measurement algorithm of the test system are pre-drafted by the user.

When a wafer is being tested by test system 1, the wafer lot is set on the prober (91a) and the wafer on the prober is selected (91b), the test shell (core program) is started (92a), the test plan is selected (92b), and the limit file is selected (92c). Thus, it is now possible to test the wafer, and once the wafer is loaded (91c), the test is started.

The dies arranged on the wafer are measured (93) in accordance with a specific order that has been determined by the test plan and the system evaluates whether the dies pass or fail the test and whether the measurements are valid or invalid using the binning from the limit file selected in 92c (94). These data are then recorded in the computer memory (95). The system determines whether or not any dies remain when the measurements for one die are finished (96), and this measurement process is repeated until the measurements of the objects to be measured on the wafer have all been completed. This process is the same as the prior art example that was previously described.

Figure 6:
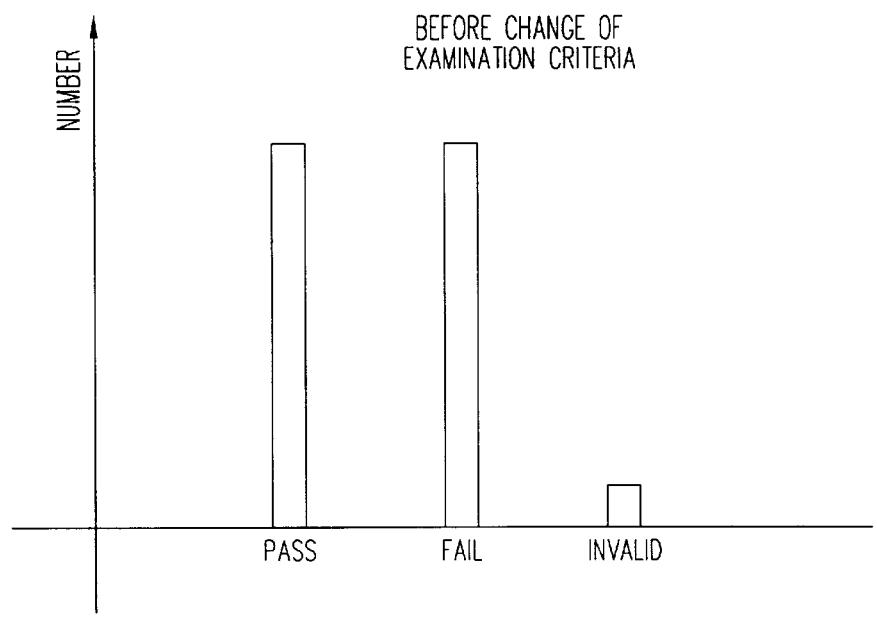
FIG. 6 is a diagram showing the results of tests before the examination criteria have been changed.

However, by means of this test process, the data for the results that indicate whether the object passed or failed the test are monitored (98). Using these results, the examination criteria can be automatically changed. For example, before changing the examination criteria in FIGS. 5 and 6, if the range of user BIN 1 (that has been designated as the SPEC for passing the test) is too narrow and the percentage of objects that are expected to pass is too low, the limits are changed (99) and user BIN 2 is designated as the SPEC for passing the test.

Figure 7:
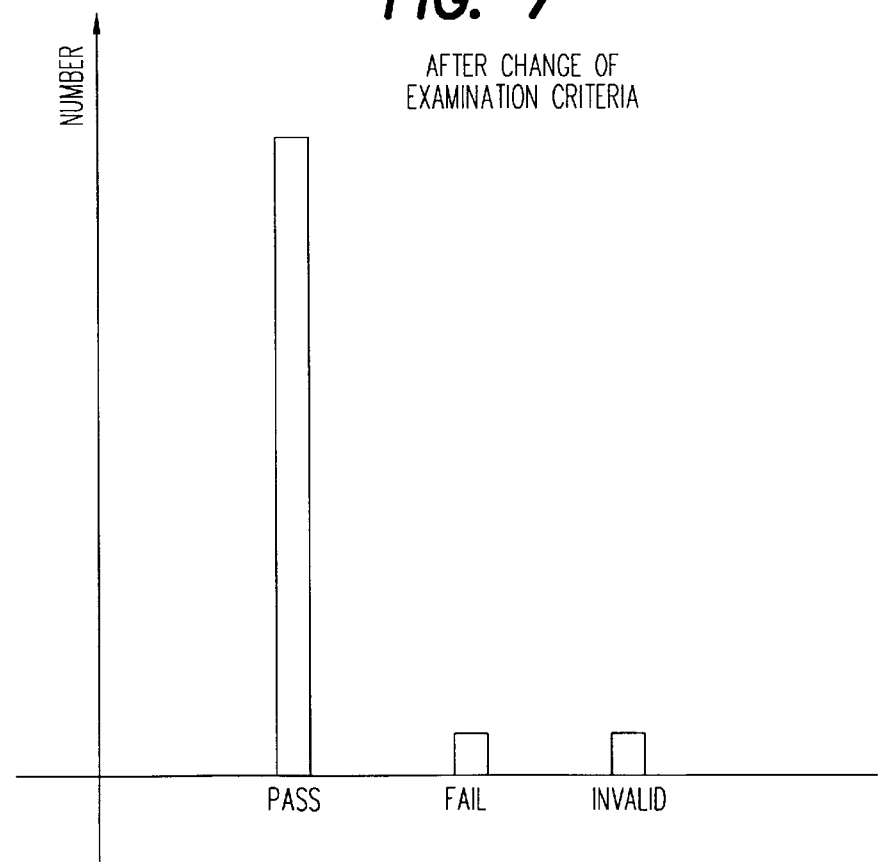
FIG. 7 is a diagram showing the results of tests after the examination criteria have been changed.
Figure 8:
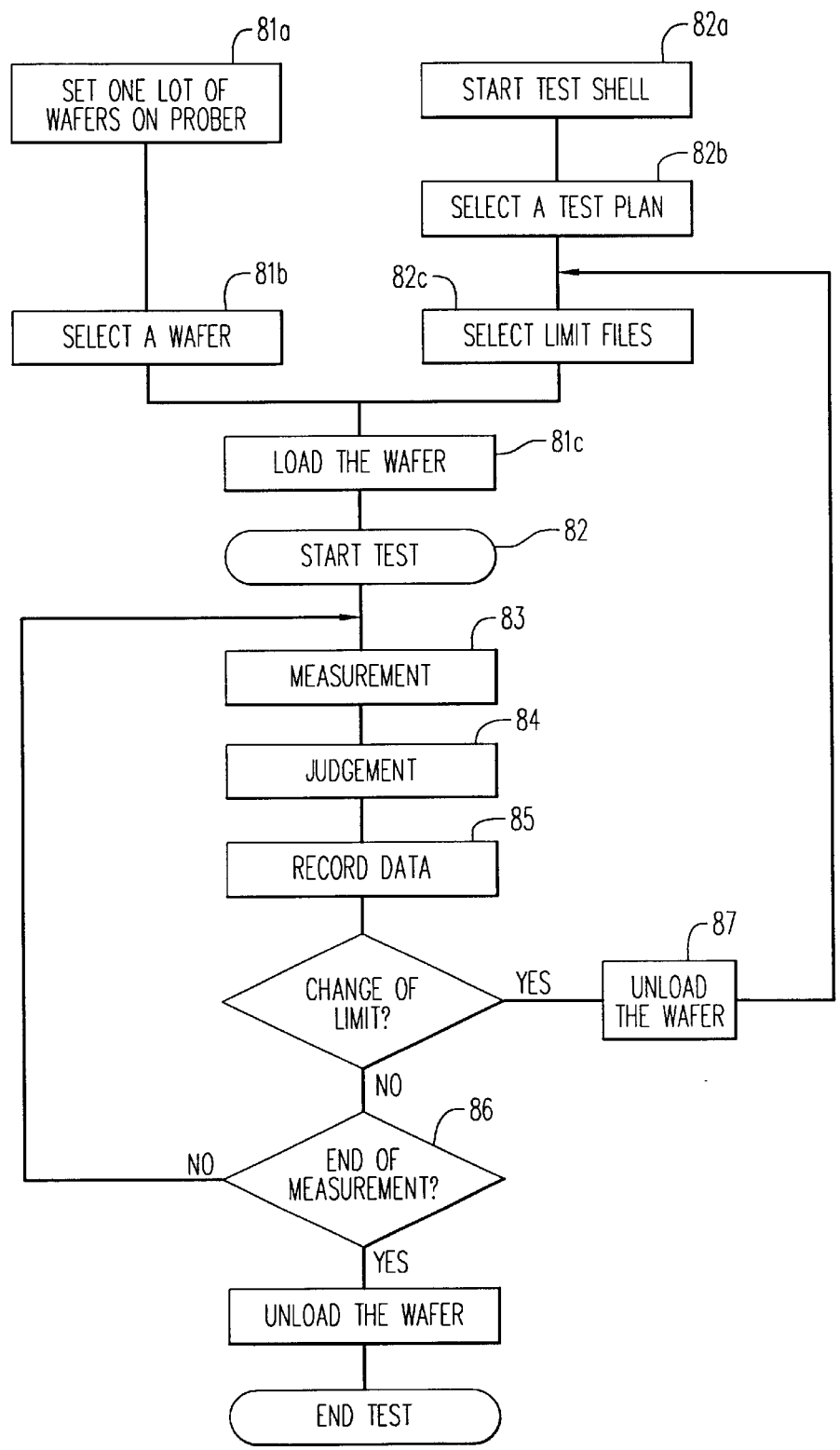
FIG. 8 is a flow chart that shows the wafer testing process of a conventional example.

Thus, as shown in FIG. 5, after the examination criteria have been changed, most of the results of the measurements performed after the change pass the test and the expected percentage of objects that pass is obtained, as shown in FIG. 7. (It is assumed here that the results of the measurements that are introduced to user BIN 2 are within the range of "passing" expected by the user in the wafer tests.)

By means of the present invention, the examination criteria can be changed without stopping the wafer tests and this makes the wafer testing process efficient.

Furthermore, the state of changing the evaluation conditions is not limited to the aforementioned description, and narrowing an examination criteria range that is too broad, or changing the range of examination criteria so that it is larger or smaller is also possible.

Moreover, the user BIN format and the measurement algorithm function by which the examination criteria can be changed during the measurement process, are elements of their own individual technology and they are not necessarily executed at the same time. That is, for instance, the binning format can be a conventional format with the upper limit and lower limit for the examination criteria, such as SPEC, VALID, etc., being entered directly as they are in the conventional format. Further, the upper and lower limits for passing the objects after changing the limits can be determined when the examination criteria are actually changed.

In addition, the aforementioned example has been explained using the case where tests of the remaining dies (or modules or devices) are continued after changing the examination criteria, but it is possible to select only the dies (or modules or devices) that have failed the test and to remeasure these units.

Moreover, changes in the examination criteria have been described in the aforementioned example as changes that are automatically performed, but a structure can also be used whereby when the necessity for changing the examination criteria is monitored and as changes become necessary, that the test is stopped, the user is warned, and the user is asked to input new examination criteria.

Moreover, when SPEC and VALID are used as the examination criteria, they can be automatically set, even if SPEC and VALID have not been clearly designated. For instance, SPEC can be set in the user BIN with the narrowest range and VALID can be set in the user BIN with the broadest range.

Moreover, the examination criteria can also be changed by predetermined ratios or increments. In addition, the examination criteria have heretofore been described as criteria that were changed using functions in measurement algorithms. By contrast, a measurement algorithm library can be used for this purpose.

Furthermore, the aforementioned example has described the case where the limits are set by being entered in a limit file and incorporated in the test plan, but it is also possible to pre-record all of the details in the test plan.

The aforementioned example has described the case where, after the examination criteria have been changed, only evaluations of passing or failing the test are changed, based on subsequent determinations. It is also possible to repeat the evaluations based on the measurement data prior to changing the examination criteria. Accordingly, in line with subsequent measurements, the results of passing or failing the test can be reported as measurements are being performed based on the examination criteria after the changes.

Results of Invention

The present invention is constructed and performs as described above, and therefore, the examination criteria for evaluating whether the test is passed or failed can be changed as wafers are being tested, making it possible to continuously test wafers through use of the best examination criteria for evaluating whether the test is passed or failed. There is no requirement to stop the test when it is determined that the original examination criteria are inappropriate. Thus, there is a marked reduction in the need for retesting, which is a process that takes a considerable amount of time. Therefore, the wafer testing process becomes efficient and the throughput of the semiconductor circuit element production process is improved.

Furthermore, several user BINs are entered in one limit file and therefore, designation of changes in the examination criteria becomes easy. Moreover, the need to draft many limit files that take into consideration a variety of scenarios of conventional methods is eliminated and as a result, even drafting of measurement software can be accomplished efficiently.

What is claimed is:

1. A semiconductor measurement instrument with the capability for dynamically changing examination criteria during a measurement operation, comprising:
    a prober for probing semiconductor elements on a wafer;
    a tester unit for feeding signals to or receiving signals from said prober; and
    a computer for controlling the prober and tester unit and for executing measurement programs which enable testing by said tester unit of a wafer contacted by said prober, said computer including program means by which criteria for evaluating whether semiconductor circuit elements on said wafer pass or fail a test are changed based on measurement results generated by said tester unit as the wafer is being tested, wherein said criteria for evaluating are changed as the wafer is being tested at least without stopping said testing of said wafer.

2. The semiconductor measurement instrument as recited in claim 1, wherein said program means establishes criteria limit bins and segregates test results into bins which encompass test limits within which said test results fall, said program means further evaluating a segregation of said test results to adjust criteria for said segregation of said test results.

3. The semiconductor measurement instrument as recited in claim 2, wherein said program means further only adjusts said criteria for said segregation of said test results after receiving user approval.

4. The semiconductor measurement instrument as recited in claim 2, wherein said program means adjusts said criteria for said segregation of said test results by predetermined amounts.

5. A semiconductor measurement instrument, comprising:
    a prober for probing semiconductor elements on a wafer;
    a tester unit for feeding signals to or receiving signals from said prober;
    a single limit file comprising examination criteria; and
    a computer for controlling the prober and tester unit and for executing measurement programs which enable testing by said tester unit of a wafer contacted by said prober, said computer including program means by which said examination criteria are used for evaluating whether semiconductor circuit elements on said wafer pass or fail a test, and by which said examination criteria obtained from said single limit file are dynamically changed based on measurement results generated by said tester unit on a given wafer, wherein said examination criteria are changed in said limit file between an initiation of a test and a termination of the test on a given wafer at least without stopping said testing of said wafer.

6. The measurement instrument of claim 5, wherein said limit file further comprises:
    a plurality of limits for evaluating whether semiconductor circuit elements on said wafer pass or fail a test; and
    a plurality of ranges, each of which are obtained by setting any two of said limits as an upper limit and a lower limit, wherein said examination criteria comprise a subset of said plurality of ranges.

7. The measurement instrument of claim 6, wherein said program means comprises a measurement algorithm function that operates to change said examination criteria by changing to a different subset of said plurality of ranges.

8. The measurement instrument of claim 5, wherein said program means establishes criteria limit bins and segregates test results into bins which encompass test limits within which said test results fall, said program means further evaluating a segregation of said test results to adjust criteria for said segregation of said test results.

9. The measurement instrument of claim 8, wherein said program means further only adjusts said criteria for said segregation of said test results after receiving user approval.

10. The measurement instrument of claim 8, wherein said program means adjusts said criteria for said segregation of said test results by predetermined amounts.

* * * * *